United States Patent
Tao et al.

(10) Patent No.: US 10,615,294 B2
(45) Date of Patent: Apr. 7, 2020

(54) VARIABLE CAPACITOR

(71) Applicant: QUALCOMM Incorporated, San Diego, CA (US)

(72) Inventors: Gengming Tao, San Diego, CA (US); Xia Li, San Diego, CA (US); Bin Yang, San Diego, CA (US); Qingqing Liang, San Diego, CA (US); Francesco Carobolante, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/007,575

(22) Filed: Jun. 13, 2018

(65) Prior Publication Data

US 2019/0386154 A1   Dec. 19, 2019

(51) Int. Cl.
| H01L 31/00 | (2006.01) |
| H01L 29/93 | (2006.01) |
| H01L 29/20 | (2006.01) |
| H01L 29/36 | (2006.01) |
| H01L 29/66 | (2006.01) |

(52) U.S. Cl.
CPC .............. *H01L 29/93* (2013.01); *H01L 29/20* (2013.01); *H01L 29/36* (2013.01); *H01L 29/66174* (2013.01)

(58) Field of Classification Search
None
See application file for complete search history.

(56) References Cited

U.S. PATENT DOCUMENTS

| 4,541,000 A | 9/1985 | Colquhoun et al. |
| 5,745,335 A * | 4/1998 | Watt .................. H01G 4/232 257/E21.011 |
| 5,915,187 A | 6/1999 | Huisman et al. |
| 6,774,448 B1 * | 8/2004 | Lindemann ......... H01L 27/1463 257/438 |
| 2008/0191260 A1 | 8/2008 | De Vreede et al. |
| 2010/0213513 A1 | 8/2010 | Zampardi et al. |
| 2013/0022077 A1 * | 1/2013 | Harmon ..................... G01J 5/20 374/178 |
| 2016/0093750 A1 | 3/2016 | Kim et al. |

FOREIGN PATENT DOCUMENTS

| GB | 2092375 A | 8/1982 |
| GB | 2103012 A | 2/1983 |
| JP | S586181 A | 1/1983 |
| JP | H07302918 A | 11/1995 |
| WO | 2011040927 A1 | 4/2011 |

OTHER PUBLICATIONS

International Search Report and Written Opinion—PCT/US2019/029855—ISO/EPO—dated Jun. 28, 2019.

* cited by examiner

*Primary Examiner* — Ali Naraghi
(74) *Attorney, Agent, or Firm* — Qualcomm Incorporated/Seyfarth Shaw LLP (57) ABSTRACT

A variable capacitor includes a mesa on a substrate. The mesa has multiple III-V semiconductor layers and includes a first side and a second side opposite the first side. The first side has a first sloped portion and a first horizontal portion. The second side has a second sloped portion and a second horizontal portion. A control terminal is on a third side of the mesa. A first terminal is on the first side of the mesa. The first terminal is disposed on the first horizontal portion and the first sloped portion. A second terminal is also on the substrate.

12 Claims, 8 Drawing Sheets

VARIABLE CAPACITOR

TECHNICAL FIELD

The present disclosure generally relates to capacitors. More specifically, the present disclosure relates to a variable capacitor.

BACKGROUND

Capacitance tuning technology is implemented in radio frequency (RF) front end (RFFE) architectures for improved circuit performance. For example, variable capacitors may be included in power amplifiers (PAs) for tuning capacitance in order to optimize matching circuitry for higher efficiency and output power.

Conventional variable capacitors are silicon (Si) complementary-metal-oxide-semiconductor (CMOS) based, and exhibit a low quality (Q)-value due to low mobility and high resistance of the substrate. Additionally, a lateral diffusion doping profile is difficult to control and limits a tuning range.

Therefore, it is desirable to have a variable capacitor that has a high tuning range, a high quality (Q)-value, and high linearity.

SUMMARY

A variable capacitor includes a mesa on a substrate. The mesa has multiple III-V semiconductor layers and includes a first side and a second side opposite the first side. The first side has a first sloped portion and a first horizontal portion. The second side has a second sloped portion and a second horizontal portion. A control terminal is on a third side of the mesa. A first terminal is on the first side of the mesa. The first terminal is disposed on the first horizontal portion and the first sloped portion. A second terminal is also on the substrate.

A method of fabricating a variable capacitor includes growing multiple III-V semiconductor layers on a substrate. The method further includes patterning the III-V semiconductor layers into a mesa. The mesa includes a first side and a second side opposite the first side. The first side has a first sloped portion and a first horizontal portion. The second side has a second sloped portion and a second horizontal portion. The method further includes coupling a control terminal to a third side of the mesa. The method further includes coupling a first terminal to a portion of the first side of the mesa. The first terminal is disposed on the first horizontal portion and the first sloped portion. The method further includes coupling a second terminal to the substrate.

A radio frequency (RF) front end module includes a variable capacitor. The variable capacitor includes a mesa on a substrate. The mesa has multiple III-V semiconductor layers. The mesa includes a first side and a second side opposite the first side. The first side has a first sloped portion and a first horizontal portion. The second side has a second sloped portion and a second horizontal portion. A control terminal is on a third side of the mesa. A first terminal is on a portion of the first side of the mesa. The first terminal is disposed on the first horizontal portion and the first sloped portion. A second terminal is also on the substrate. An antenna is coupled to the variable capacitor.

This has outlined, rather broadly, the features and technical advantages of the present disclosure in order that the detailed description that follows may be better understood. Additional features and advantages of the present disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR." As described herein, the term "exemplary" used throughout this description means "serving as an example, instance, or illustration," and should not necessarily be construed as preferred or advantageous over other exemplary configurations. The term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Mobile radio frequency (RF) chip designs (e.g., mobile RF transceivers) have migrated to a deep sub-micron process node due to cost and power consumption considerations. The design complexity of mobile RF transceivers is further complicated by added circuit functions to support communication enhancements, such as carrier aggregation. Further design challenges for mobile RF transceivers include the use of passive devices, which directly affect analog/RF performance considerations, including mismatch, noise, and other performance considerations.

Passive devices may involve high performance inductor and capacitor components. For example, an RF module (e.g., an RF front end (RFFE) module) may include inductors (L) and capacitors (C) arranged to form diplexers, triplexers, multiplexers, low pass filters, balun filters, and/or notch filters to prevent high order harmonics. These passive devices and components may be implemented as passive on glass devices, integrated passive devices, or other like passive devices. Arrangements of these passive devices may be selected to improve device performance, while suppressing unwanted noise (e.g., artificial harmonics) to support advanced RF applications such as millimeter wave communications and carrier aggregation. The design of these mobile RF transceivers includes the use of additional passive devices, for example, to suppress resonance, and/or to perform filtering, bypassing, and coupling.

Capacitors are passive elements used in integrated circuits for storing an electrical charge. Capacitors are often made using plates or structures that are conductive with an insulating material between the plates. The amount of storage, or capacitance, for a given capacitor is contingent upon the materials used to make the plates and the insulator, the area of the plates, and the spacing between the plates. The insulating material is often a dielectric material.

Capacitance tuning technology is implemented in radio frequency (RF) front end (RFFE) architectures for improved circuit performance. For example, variable capacitors may be included in power amplifiers (PAs) for tuning capacitance in order to optimize matching circuitry for higher efficiency and output power.

Conventional variable capacitors are silicon (Si) complementary-metal-oxide-semiconductor (CMOS) based, and exhibit a low quality (Q)-value due to low mobility and high resistance of the substrate. Additionally, a lateral diffusion doping profile is difficult to control and limits a tuning range. Therefore, it is desirable to have a variable capacitor that has a high tuning range, a high quality (Q)-value, and high linearity.

Aspects of the present disclosure integrate a variable capacitor into a III-V semiconductor for improved functionality. For example, the III-V semiconductor may include gallium arsenide (GaAs) or any other III-V material in RFFE chips.

Figure 1:
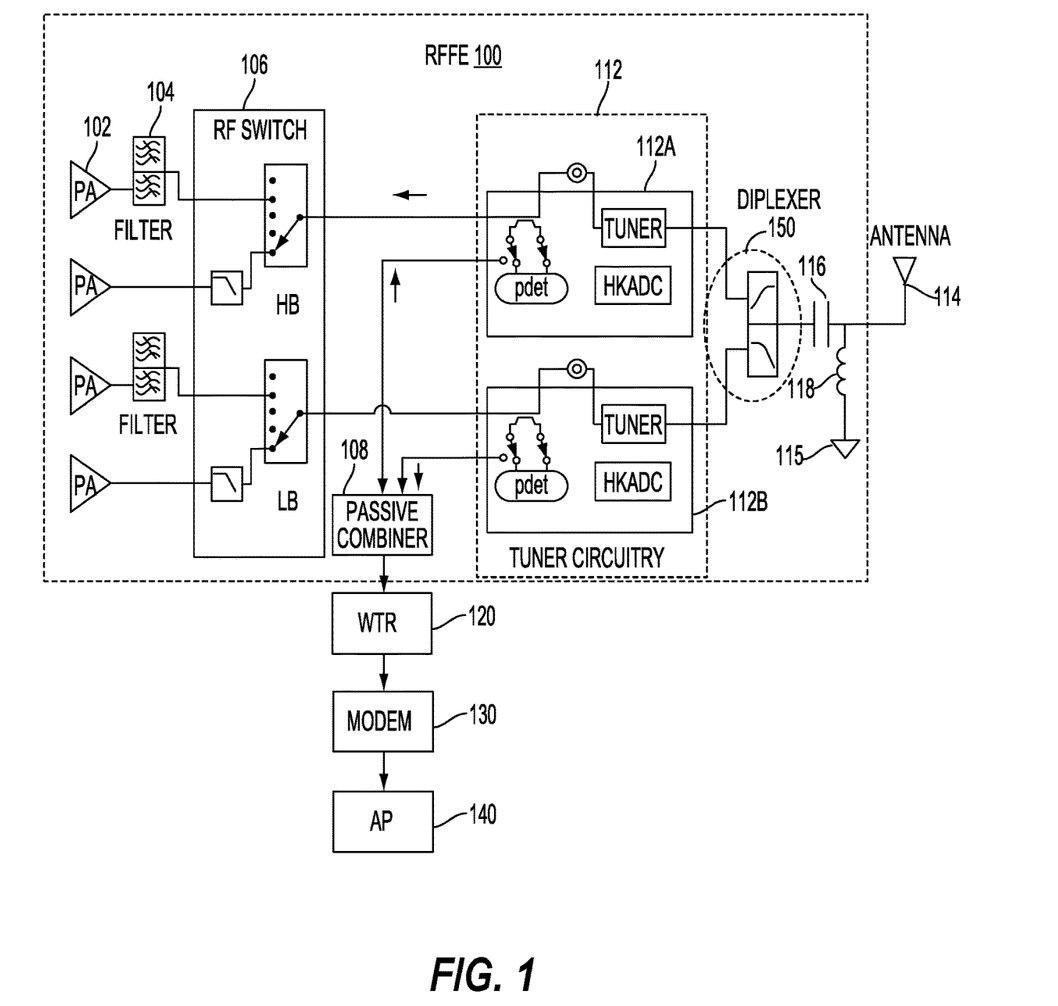
FIG. 1 is a schematic diagram of a radio frequency (RF) front end (RFFE) module employing passive devices.

FIG. 1 is a schematic diagram of a radio frequency (RF) front end (RFFE) module 100 employing a diplexer 150. The RFFE 100 may include a variable capacitor. The RFFE 100 includes power amplifiers 102, duplexer/filters 104, and a radio frequency (RF) switch module 106. The power amplifiers 102 amplify signal(s) to a certain power level for transmission. The duplexer/filters 104 filter the input/output signals according to a variety of different parameters, including frequency, insertion loss, rejection, or other like parameters. In addition, the RF switch module 106 may select certain portions of the input signals to pass on to the rest of the RF front end module 100.

The radio frequency (RF) front end module 100 also includes tuner circuitry 112 (e.g., first tuner circuitry 112A and second tuner circuitry 112B), the diplexer 150, a capacitor 116, an inductor 118, a ground terminal 115, and an antenna 114. The tuner circuitry 112 (e.g., the first tuner circuitry 112A and the second tuner circuitry 112B) includes components such as a tuner, a portable data entry terminal (PDET), and a house keeping analog to digital converter (HKADC). The tuner circuitry 112 may perform impedance tuning (e.g., a voltage standing wave ratio (VSWR) optimization) for the antenna 114. The RF front end module 100 also includes a passive combiner 108 coupled to a wireless transceiver (WTR) 120. The passive combiner 108 combines the detected power from the first tuner circuitry 112A and the second tuner circuitry 112B. The wireless transceiver 120 processes the information from the passive combiner 108 and provides this information to a modem 130 (e.g., a mobile station modem (MSM)). The modem 130 provides a digital signal to an application processor (AP) 140.

As shown in FIG. 1, the diplexer 150 is between the tuner component of the tuner circuitry 112 and the capacitor 116, the inductor 118, and the antenna 114. The diplexer 150 may be placed between the antenna 114 and the tuner circuitry 112 to provide high system performance from the RF front end module 100 to a chipset including the wireless transceiver 120, the modem 130, and the application processor 140. The diplexer 150 also performs frequency domain multiplexing on both high band frequencies and low band frequencies. After the diplexer 150 performs its frequency multiplexing functions on the input signals, the output of the diplexer 150 is fed to an optional LC (inductor/capacitor) network including the capacitor 116 and the inductor 118. The LC network may provide extra impedance matching components for the antenna 114, when desired. Then a signal with the particular frequency is transmitted or received by the antenna 114. Although a single capacitor and inductor are shown, multiple components are also contemplated.

Figure 2:
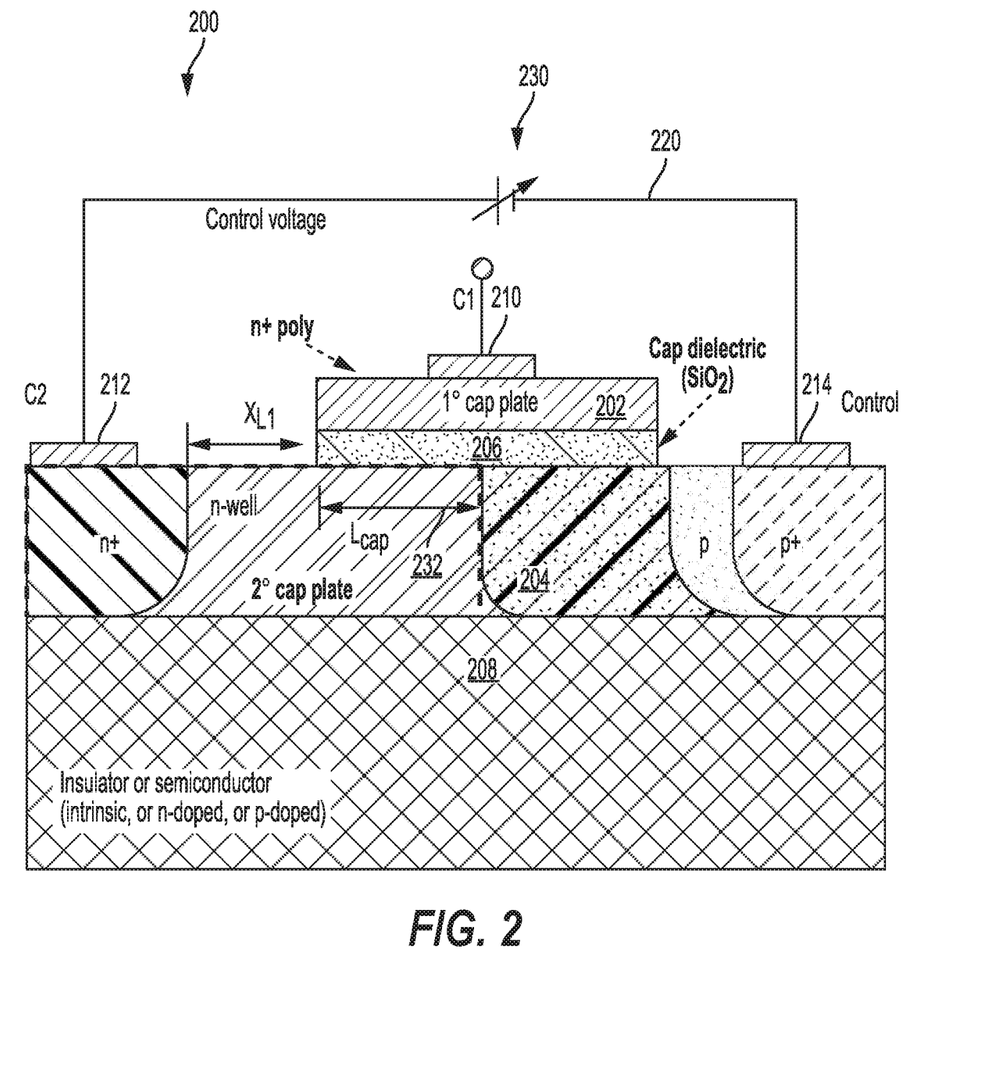
FIG. 2 is a diagram of a conventional variable capacitor.

FIG. 2 is a diagram of a conventional variable capacitor 200. The conventional variable capacitor 200 includes a first plate 202 coupled to a semiconductor layer 204 through a dielectric layer 206. The semiconductor layer 204 is supported by a substrate 208. A first terminal 210 is coupled to the first plate 202. A second terminal 212 is coupled to a control terminal 214 through a control line 220.

A control voltage 230 applied across the control line 220 controls a capacitance of the conventional variable capacitor 200 by varying a lateral diffusion doping profile 232 of the semiconductor layer 204. The capacitance increases as the lateral diffusion doping profile 232 increases, and the capacitance decreases as the lateral diffusion doping profile 232 decreases. The capacitance may be tuned across the first terminal 210 and the second terminal 212.

Disadvantages of the conventional variable capacitor 200 include low quality (Q)-value due to low electron mobility, high resistance in the semiconductor layer 204, difficulty controlling the lateral diffusion doping profile 232, and limits to the tuning range. Additionally, the conventional variable capacitor 200 is difficult to integrate into a III-V semiconductor power amplifier die, due to incompatible materials.

Aspects of the present disclosure integrate a variable capacitor into a III-V semiconductor for improved functionality. For example, the III-V semiconductor may include gallium arsenide (GaAs) or any other III-V material in RFFE chips.

According to aspects of the present disclosure, a variable capacitor may include a mesa having multiple III-V semiconductor layers. The mesa may include a first side and a second sloped opposite the first sloped side. The mesa may be on a substrate. A control terminal may be on a third side of the mesa. A first terminal may be on a sloped portion and also a horizontal portion of the first side of the mesa. A second terminal may be on the substrate.

Figure 3A:
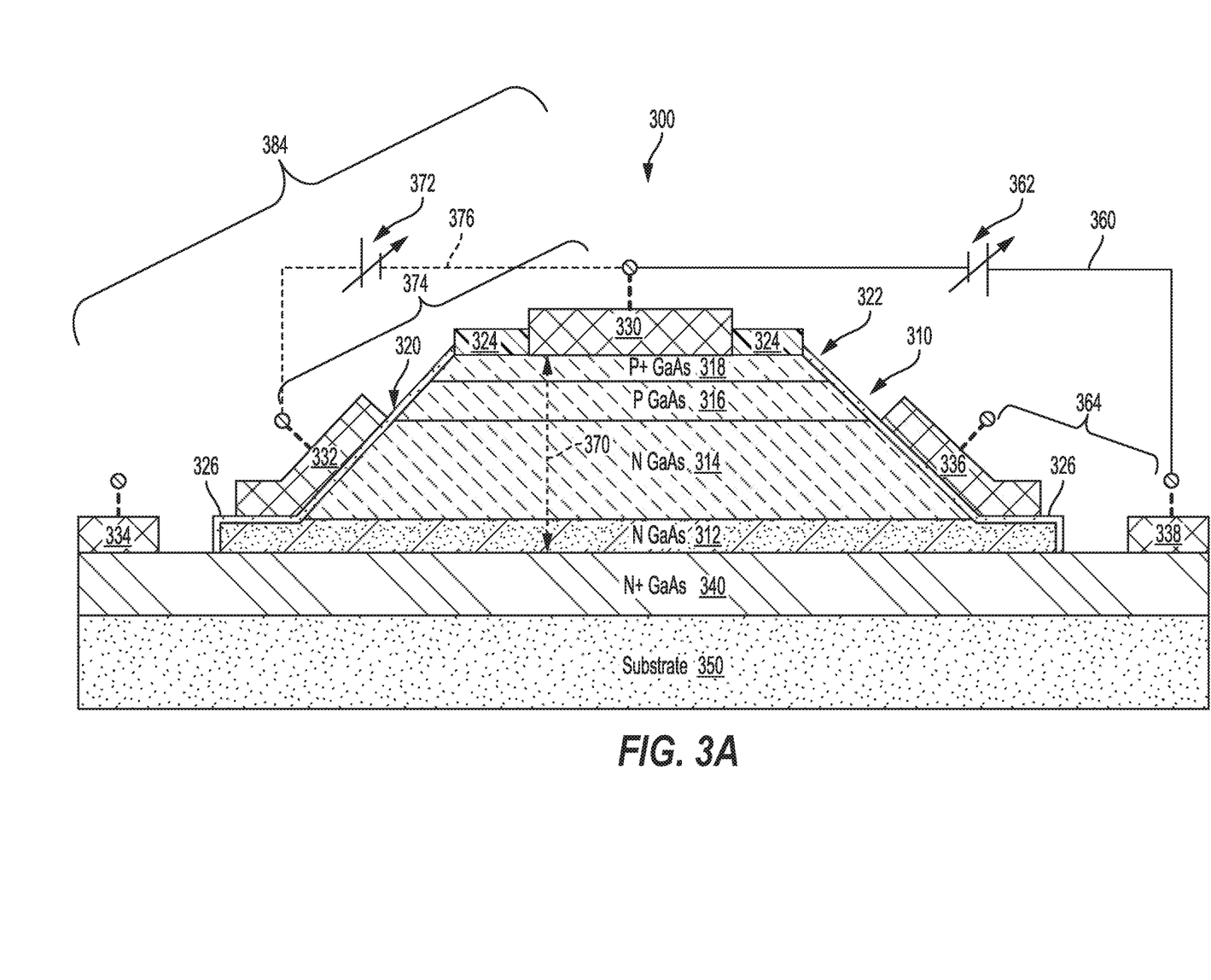
FIGS. 3A-3C are cross-sectional views illustrating variable capacitors, according to aspects of the present disclosure.

FIG. 3A is a cross-sectional view illustrating a variable capacitor 300, according to aspects of the present disclosure. The variable capacitor 300 may include a mesa 310 having multiple III-V semiconductor layers (e.g., 312-318). For example, a first layer 312 and a second layer 314 may each be an N doped gallium arsenide (GaAs) layer. The first layer 312 and the second layer 314 may have a same or a different width. For example, the second layer 314 may be wider or narrower than the first layer 312. A third layer 316 may be P doped GaAs, and a fourth layer 318 may be P+ doped GaAs. The third layer 316 and the fourth layer 318 may also have a same or a different width.

According to an aspect of the present disclosure, the mesa 310 may be substantially trapezoidally shaped. For example, the mesa 310 may include a first side 320 having a sloped portion and a horizontal portion. The mesa 310 also includes a second side 322 opposite the first sloped side 320. The second side also has a sloped portion and a horizontal portion. The mesa 310 is supported by a substrate 350. For example, the substrate 350 may be N+ doped above $10^{18}$ $cm^{-3}$. A semiconductor layer 340 operating as a sub-collector is between the mesa 310 and the substrate 350.

According to aspects of the present disclosure, a dielectric layer 324 may be on a top portion of the mesa 310. For example, the dielectric layer 324 may be any dielectric material. A thin dielectric layer 326 may be on the first side 320 and the second side 322. For example, the thin dielectric layer 326 may be silicon oxide, silicon nitride, aluminum oxide, gallium oxide or the like. The thin dielectric layer 326 can have a thickness of 30 to 50 angstroms, depending on the material.

A first control terminal 330 (e.g., a control terminal) may be on a third side of the mesa 310. A first terminal 332 may be on a portion of the first side 320 of the mesa 310. For example, the first terminal 332 may be on a horizontal portion and a sloped portion of the first side 320. A second terminal 334 may be on the substrate 350, proximate to the first side 320. The second terminal 334 may be on a front-side of the substrate 350, for example, directly on the semiconductor layer 340.

A third terminal 336 may be on the second side 322. A fourth terminal 338 may be on the substrate 350, proximate to the second side 322. The fourth terminal 338 may be on a front-side of the substrate 350, for example, directly on the semiconductor layer 340. The fourth terminal 338 may be on a horizontal portion and a sloped portion of the second side 322. According to aspects of the present disclosure, any of the first terminal 332, the second terminal 334, the third terminal 336, and/or the fourth terminal 338 may include a metal stack.

A first control line 360 (e.g., a control line) may be coupled between any combination of the first control terminal 330, the first terminal 332, the second terminal 334, the third terminal 336, and/or the fourth terminal 338. For example, as illustrated, the first control line 360 is coupled between the first control terminal 330 and the fourth terminal 338.

A first voltage 362 may be applied across the first control line 360 to tune a first capacitance 364 of the variable capacitor 300. In this example, the third terminal 336 and the fourth terminal 338 are plates of the capacitor. Adjusting the first voltage 362 between the first control terminal 330 and the fourth terminal 338 may increase or decrease a dopant area and a doping profile in the mesa 310. As the dopant area and the doping profile increase, a first capacitance 364 increases. As the dopant area and the doping profile decrease, the first capacitance 364 decreases.

The first capacitance 364 of the variable capacitor 300 may be tuned across any combination of a pair of the first control terminal 330, the first terminal 332, the second terminal 334, the third terminal 336, and/or the fourth terminal 338. For example, as illustrated, the first capacitance 364 is tuned across the third terminal 336 and the fourth terminal 338. The first capacitance 364 may also be tuned across the first control terminal 330 and the third terminal 336, and between the first control terminal 330 and the fourth terminal 338.

Figure 3B:
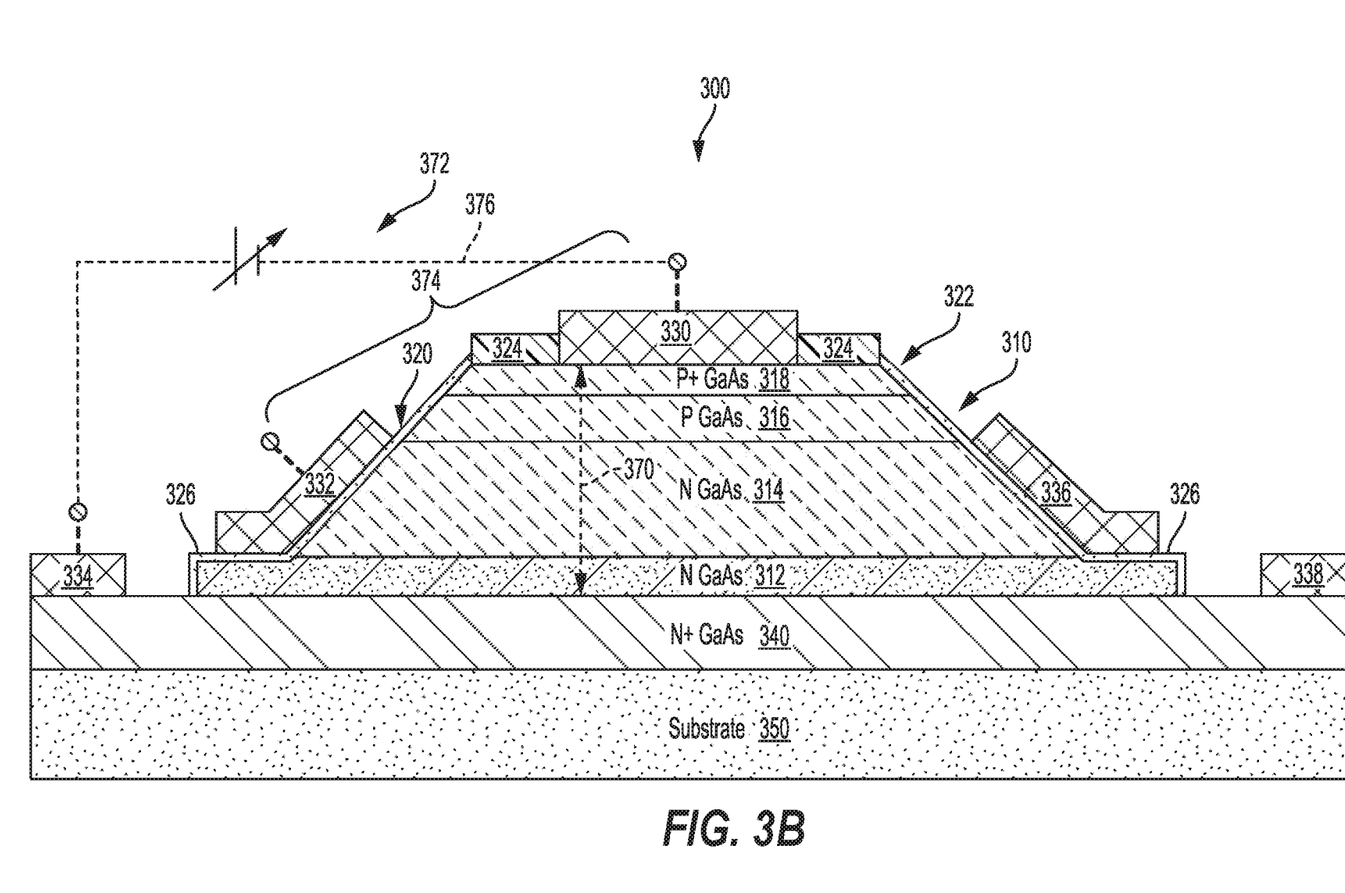

According to an aspect of the present disclosure, a second control line 376 may be coupled between any combination of the first control terminal 330, the first terminal 332, the second terminal 334, the third terminal 336, and/or the fourth terminal 338. For example, the second control line 376 may be coupled between the first control terminal 330 and the second terminal 334, as depicted in FIG. 3B.

Figure 3C:
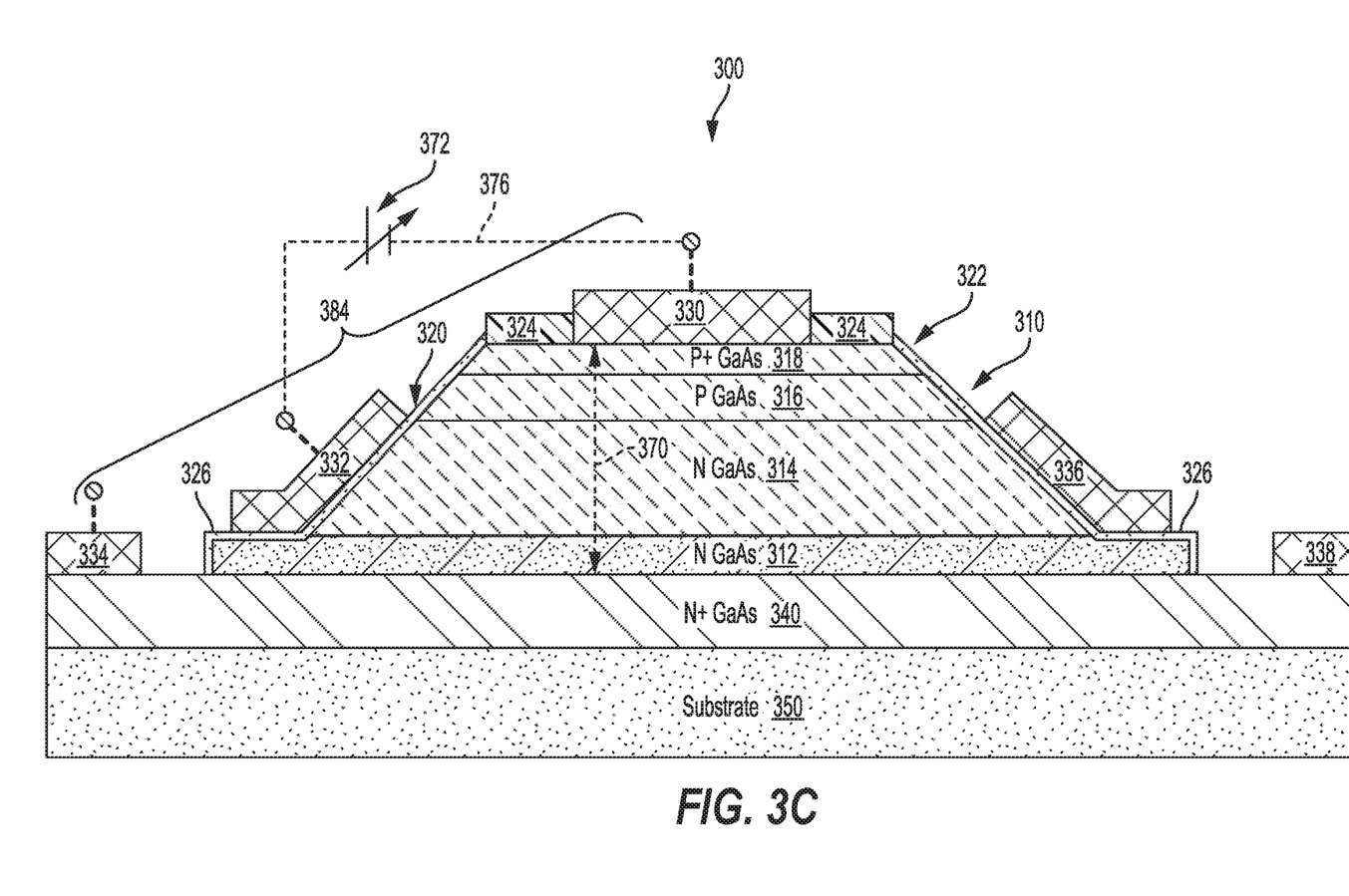

A second voltage 372 may be applied across the second control line 376 to tune a second capacitance 374 of the variable capacitor 300. In this example, the capacitor plates are the first control terminal 330 and the first terminal 332. Adjusting the second voltage 372 between the first control terminal 330 and the second terminal 334 may increase or decrease a dopant area and doping profile in the mesa 310. As the dopant area and the doping profile increase, the second capacitance 374 increases. As the dopant area and the doping profile decrease, the second capacitance 374 decreases. In yet another example, the second voltage 372 tunes a third capacitance 384 (FIG. 3C). In this example, the capacitor plates are the first control terminal 330 and the second terminal 334.

According to additional aspects of the present disclosure (not shown), the first capacitance 364 and/or the second capacitance 374 and/or the third capacitance 384 may be tuned through the second terminal 334 and the fourth terminal 338 through the semiconductor layer 340. For example, the semiconductor layer 340 may be an N+ doped GaAs layer. As a result, the second terminal 334 and the fourth terminal 338 may be coupled to each other through the semiconductor layer 340.

According to an aspect of the present disclosure, the doping profile 370 is graded (e.g., a graded doping profile). For example, the doping profile 370 may be heavily P doped proximate to the first control terminal 330, and uniformly P doped to graded N doped. In another example, the doping profile is heavily P doped proximate to the first control terminal 330 and graded P doped to graded N doped. Alternatively, the doping profile 370 may be heavily N doped proximate to the first control terminal 330 and uniformly N doped to graded P doped. In yet another example, the doping profile 370 is heavily N doped proximate to the first control terminal 330 and graded N doped to graded P doped. The doping profile 370 may also be evenly P doped and N doped.

According to aspects of the present disclosure, any of the first terminal 332, the second terminal 334, the third terminal 336, and/or the fourth terminal 338 may include a Schottky or metal-on-insulator contact. Additionally, any of the first control terminal 330, the first terminal 332, the second terminal 334, the third terminal 336, and/or the fourth terminal 338 may include ohmic contacts.

According to additional aspects of the present disclosure, the multiple III-V semiconductor layers (e.g., 312-318) may be indium gallium arsenide (InGaAs) and indium phosphate (InP) rather than GaAs. For example, the first layer 312 and the second layer 314 may each be an N doped InP layer. The third layer 316 may be P doped InP, and the fourth layer 318 may be P+ doped InGaAs. Additionally, the semiconductor layer 340 may be N+ InGaAs rather than N+ GaAs.

Advantages of the variable capacitor 300 include high quality (Q)-value due to high electron mobility and low substrate resistance. Additionally, the trapezoidal shape of the mesa 310 and multiple contacts allow for finer capacitance tuning. The variable capacitor 300 may also be easily implemented into a III-V semiconductor die because the variable capacitor 300 already uses III-V semiconductor materials.

Figure 4:
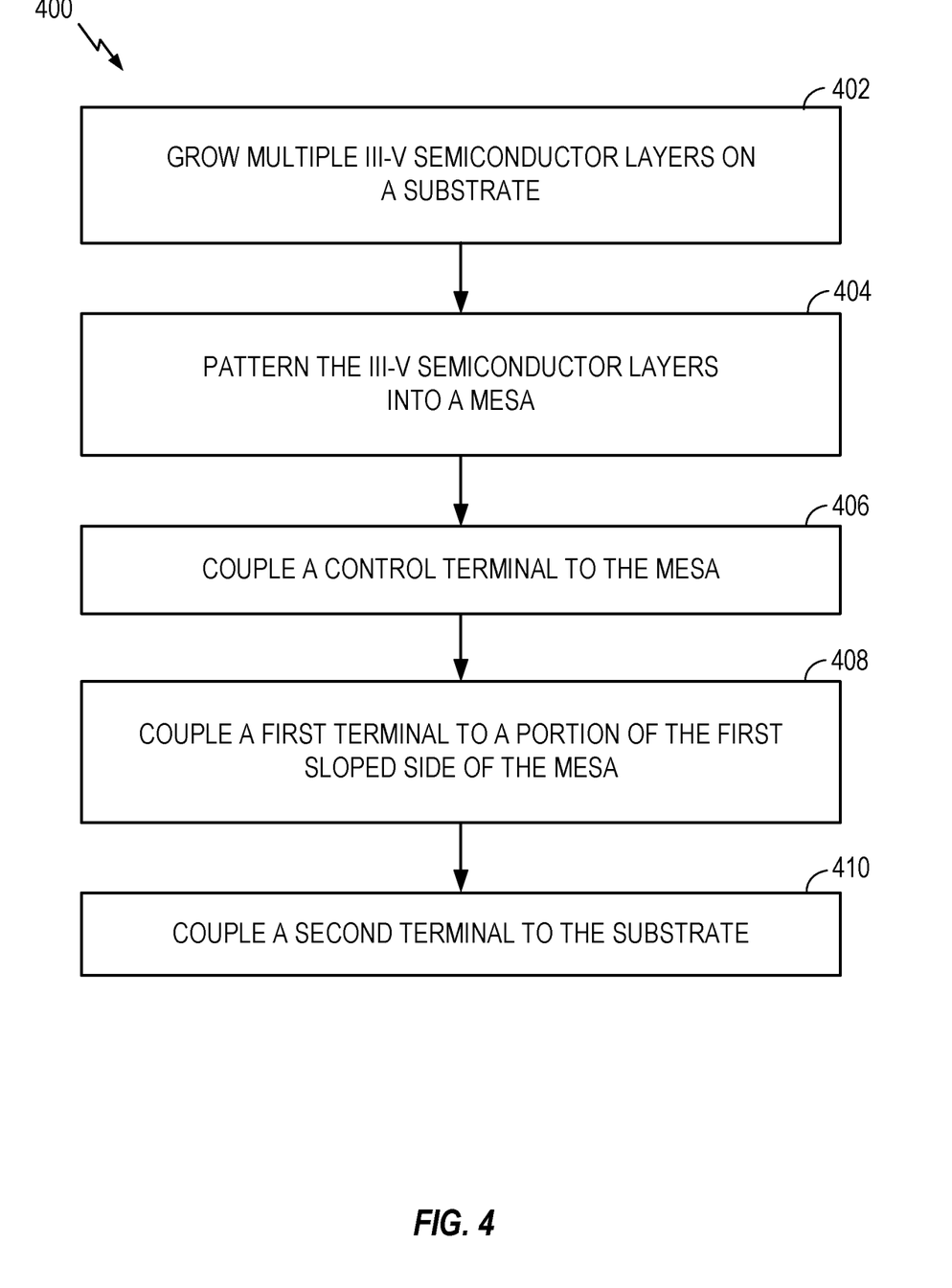
FIG. 4 illustrates a method of fabricating a variable capacitor, according to aspects of the present disclosure.

FIG. 4 illustrates a method 400 of fabricating a variable capacitor, according to aspects of the present disclosure. In block 402, III-V semiconductor layers are grown on a substrate. For example, as shown in FIGS. 3A-3C, multiple III-V semiconductor layers (e.g., 312-318) may be grown on the substrate 350.

In block 404, the III-V semiconductor layers are patterned into a mesa. The mesa may include a first side and a second side opposite the first sloped side. The first and second sides have sloped portions and horizontal portions. For example, as shown in FIGS. 3A-3C, the mesa 310 may be substantially trapezoidally shaped. The mesa 310 may include the first side 320 and the second side 322 opposite the first side 320.

In block 406, a control terminal is coupled to a third side of the mesa. For example, as shown in FIGS. 3A-3C, the first control terminal 330 may be coupled to the top portion of the mesa 310.

In block 408, a first terminal is coupled to a portion of the first side of the mesa. The first terminal is on the horizontal portion and the sloped portion of the first side. For example, as shown in FIGS. 3A-3C, the first terminal 332 is on a horizontal portion and a sloped portion of the first side 320.

In block 410, a second terminal is coupled to the substrate. For example, as shown in FIGS. 3A-3C, the second terminal 334 is on the substrate 350, proximate to the first sloped side 320. The second terminal 334 may be on a front-side of the substrate 350, directly on the semiconductor layer 340.

According to the present disclosure, an integrated circuit device includes means for controlling. For example, the controlling means may be the first control terminal 330, as shown in FIGS. 3A-3C. In another aspect, the aforementioned means may be any module or any apparatus configured to perform the functions recited by the aforementioned means.

Figure 5:
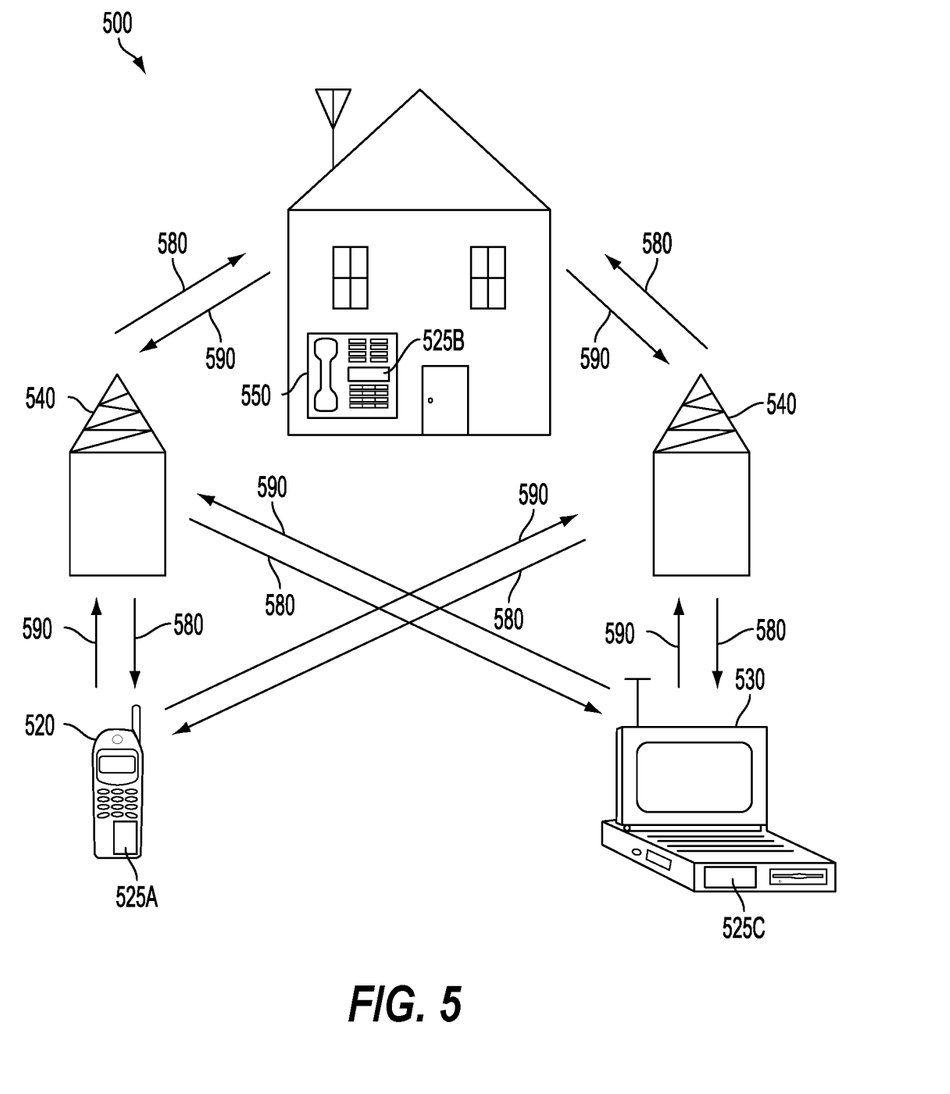
FIG. 5 is a block diagram showing an exemplary wireless communication system in which a variable capacitor and device structures may be advantageously employed.

FIG. 5 is a block diagram showing an exemplary wireless communication system 500 in which an aspect of the present disclosure may be advantageously employed. For purposes of illustration, FIG. 5 shows three of the remote units 520, 530, and 550 and two of the base stations 540. It will be recognized that wireless communication systems may have many more remote units and base stations. Remote units 520, 530, and 850 include IC devices 525A, 525C, and 525B that include the disclosed variable capacitor and device structures. It will be recognized that other devices may also include the disclosed variable capacitor and device structures, such as the base stations, switching devices, and network equipment. FIG. 5 shows forward link signals 580 from one of the base stations 540 to the remote units 520, 530, and 550 and reverse link signals 590 from the remote units 520, 530, and 550 to base stations 540.

In FIG. 5, one of the remote units 520 is shown as a mobile telephone, one of the remote units 530 is shown as a portable computer, and remote unit 550 is shown as a fixed location remote unit in a wireless local loop system. For example, the remote units may be a mobile phone, a hand-held personal communication systems (PCS) unit, a portable data unit such as a personal digital assistant (PDA), a GPS enabled device, a navigation device, a set top box, a music player, a video player, a communications device, an entertainment unit, a fixed location data unit such as a meter reading equipment, or other devices that store or retrieve data or computer instructions, or combinations thereof. Although FIG. 5 illustrates remote units according to the aspects of the present disclosure, the present disclosure is not limited to these exemplary illustrated units. Aspects of the present disclosure may be suitably employed in many devices, which include the disclosed variable capacitor and device structures.

Figure 6:
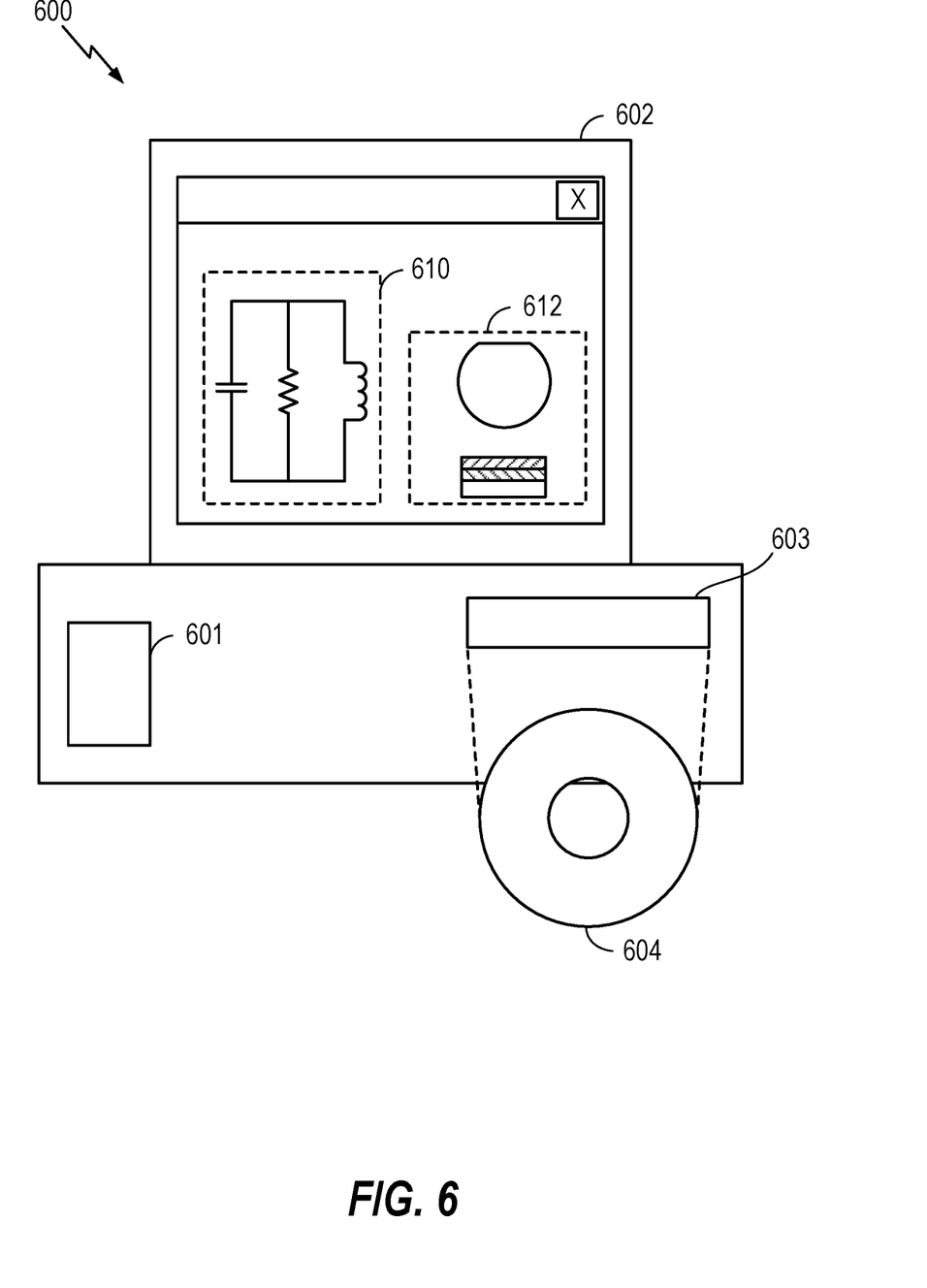
FIG. 6 is a block diagram illustrating a design workstation used for circuit, layout, and logic design of a variable capacitor and device structures.

FIG. 6 is a block diagram illustrating a design workstation used for circuit, layout, and logic design of the variable capacitor and device structures disclosed above. A design workstation 600 includes a hard disk 601 containing operating system software, support files, and design software such as Cadence or OrCAD. The design workstation 600 also includes a display 602 to facilitate design of a circuit 610 or a variable capacitor and device structures 612. A storage medium 604 is provided for tangibly storing the design of the circuit 610 or the variable capacitor and device structures 612. The design of the circuit 610 or the variable capacitor and device structures 612 may be stored on the storage medium 604 in a file format such as GDSII or GERBER. The storage medium 604 may be a CD-ROM, DVD, hard disk, flash memory, or other appropriate device. Furthermore, the design workstation 600 includes a drive apparatus 603 for accepting input from or writing output to the storage medium 604.

Data recorded on the storage medium 604 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 604 facilitates the design of the circuit 610 or the variable capacitor and device structures 612 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the present disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods, and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the present disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the present disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The steps of a method or algorithm described in connection with the present disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media.

The previous description of the present disclosure is provided to enable any person skilled in the art to make or use the present disclosure. Various modifications to the present disclosure will be readily apparent to those skilled in the art, and the generic principles defined herein may be applied to other variations without departing from the spirit or scope of the present disclosure. Thus, the present disclosure is not intended to be limited to the examples and designs described herein but is to be accorded the widest scope consistent with the principles and novel features disclosed herein.

What is claimed is:

1. A variable capacitor comprising:
   a mesa on a semiconductor layer, which is on a substrate,
      the mesa having a plurality of III-V semiconductor layers and including a first side and a second side opposite the first side, the first side having a first sloped portion and a first horizontal portion, the second side having a second sloped portion and a second horizontal portion;

a control terminal on a third side of the mesa;

a first terminal on the first side of the mesa, the first terminal disposed on the first horizontal portion and the first sloped portion; and a second terminal on the semiconductor layer.

2. The variable capacitor of claim 1, further comprising:
a third terminal on the second side of the mesa; and
a fourth terminal on the semiconductor layer.

3. The variable capacitor of claim 2, further comprising a control line coupled between a plurality of terminals comprising at least two of the control terminal, the first terminal, the second terminal, the third terminal, and the fourth terminal.

4. The variable capacitor of claim 1, in which the mesa has a graded doping profile.

5. The variable capacitor of claim 4, in which the graded doping profile is heavily P doped proximate the control terminal, uniformly P doped to graded N doped, and/or graded P doped to graded N doped.

6. The variable capacitor of claim 4, in which the graded doping profile is heavily N doped proximate to the control terminal, and uniformly N doped to graded P doped, and/or graded N doped to graded P doped away from the control terminal.

7. The variable capacitor of claim 4, in which the graded doping profile is evenly P doped and N doped.

8. The variable capacitor of claim 1, in which the second terminal is on a front-side of the semiconductor layer.

9. The variable capacitor of claim 1, in which the semiconductor layer is N+ doped above $10^{18}$ cm$^{-3}$.

10. The variable capacitor of claim 1, in which the first terminal comprises a Schottky or metal-on-insulator contact.

11. The variable capacitor of claim 1, in which the control terminal and the second terminal comprise ohmic contacts.

12. The variable capacitor of claim 1, integrated into a radio frequency (RF) front end module, the RF front end module incorporated into at least one of a music player, a video player, an entertainment unit, a navigation device, a communications device, a personal digital assistant (PDA), a fixed location data unit, a mobile phone, and a portable computer.

* * * * *